(12) United States Patent
Chang et al.

(10) Patent No.: US 8,981,407 B2
(45) Date of Patent: Mar. 17, 2015

(54) LIGHT EMITTING DIODE PACKAGE WITH LENS AND METHOD FOR MANUFACTURING THE SAME

(71) Applicant: Advanced Optoelectronic Technology, Inc., Hsinchu Hsien 303 (TW)

(72) Inventors: Chung-Min Chang, Hsinchu (TW); Chien-Lin Chang-Chien, Hsinchu (TW); Hsuen-Feng Hu, Hsinchu (TW); Yu-Wei Tsai, Hsinchu (TW); Chang-Wen Sun, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/919,755

(22) Filed: Jun. 17, 2013

(65) Prior Publication Data

US 2014/0001505 A1 Jan. 2, 2014

(30) Foreign Application Priority Data

Jun. 29, 2012 (CN) .......................... 2012 1 0221020 2

(51) Int. Cl.
*H01L 33/00* (2010.01)
*H01L 33/60* (2010.01)

(52) U.S. Cl.
CPC ............ *H01L 33/60* (2013.01); *H01L 2933/005* (2013.01); *H01L 2924/0002* (2013.01); *H01L 2224/48091* (2013.01)
USPC .................. 257/98; 257/81; 257/88; 257/89; 257/99; 257/100

(58) Field of Classification Search
None
See application file for complete search history.

(56) References Cited

U.S. PATENT DOCUMENTS

| | | | | |
|---|---|---|---|---|
| 6,661,084 B1 * | 12/2003 | Peterson et al. | ............... | 257/680 |
| 7,126,273 B2 * | 10/2006 | Sorg | ............... | 313/512 |
| 7,365,371 B2 * | 4/2008 | Andrews | ............... | 257/99 |
| 8,049,230 B2 * | 11/2011 | Chan et al. | ............... | 257/89 |
| 2006/0043401 A1 * | 3/2006 | Lee et al. | ............... | 257/99 |
| 2012/0097985 A1 | 4/2012 | Liu et al. | | |

FOREIGN PATENT DOCUMENTS

| | | |
|---|---|---|
| JP | 2012-89848 | 5/2012 |
| KR | 10-0964812 | 6/2010 |

* cited by examiner

*Primary Examiner* — Kyoung Lee
(74) *Attorney, Agent, or Firm* — Novak Druce Connolly Bove + Quigg LLP

(57) ABSTRACT

A light emitting diode (LED) package includes a substrate with a flat top surface, an LED chip mounted on the substrate, and a group of blocking structure and encapsulation body. The LED chip electrically connects with the substrate. The blocking structure surrounds the LED chip. The encapsulation body covers the LED chip. A bottom of the encapsulation body is enclosed by the blocking structure; the encapsulation body has a light outputting surface, and an outer surface of the blocking structure is continuously connected with the light outputting surface. The light outputting surface has a semi-spherical profile. An angle between a normal line extending from the outer surface of the blocking structure and perpendicular to the substrate and a tangent line tangent to the light outputting surface at a point thereof adjacent to the outer surface is smaller than 60 degrees.

15 Claims, 6 Drawing Sheets

LIGHT EMITTING DIODE PACKAGE WITH LENS AND METHOD FOR MANUFACTURING THE SAME

BACKGROUND

1. Technical Field

The present disclosure generally relates to light sources, and particularly to a light emitting diode (LED) package with lens and a method for manufacturing the LED package with lens.

2. Description of the Related Art

LEDs are solid state light emitting sources, which are more stable and reliable than other conventional light sources such as incandescent bulbs. Thus, LEDs are being widely used in various fields such as numeral/character displaying elements, signal lights, light sources for lighting and display devices. A lens is usually attached to an LED chip of the LED to modulate lights emitted from the LED.

Conventionally, the lens is formed by injection molding or dispensing molding. When the lens is formed by injection molding, the lens is formed firstly, and then is adhered to a substrate by glue to cover an LED chip mounted on the substrate. However, it costs more to use the injection molding. When the lens is formed by dispensing molding, glue is directly dispensed and cured on the substrate to form the lens. However, the lens formed by the dispensing molding has a large radius of curvature whereby an angle of incidence of light generated by the LED die to a light output surface of the lens is more likely to be equal to or larger than a critical angle of the lens. In this state, more light is prone to be totally reflected by the lens. Thus, the LED has a low light output efficiency.

Therefore, it is desirable to provide an LED package with lens which can overcome the above-described problems.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present LED package with lens. Moreover, in the drawings, all the views are schematic, and like reference numerals designate corresponding parts throughout the views.

DETAILED DESCRIPTION

Figure 1:
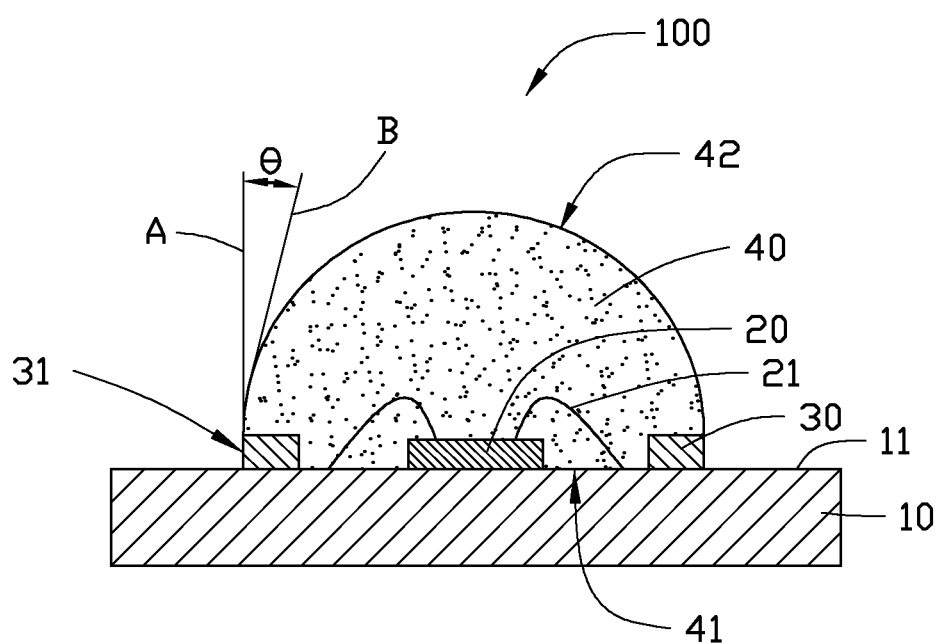
FIG. 1 is a cross-sectional view of an LED package with lens in accordance with one embodiment of the present disclosure.

Referring to FIG. 1, an LED package 100 in accordance with a first exemplary embodiment is provided. The LED package 100 includes a substrate 10, an LED chip 20 mounted on the substrate 10, a blocking structure 30 arranged around the LED chip 20, and an encapsulation body 40 covering the LED chip 20 and the blocking structure 30.

Specifically, the substrate 10 is rectangular, and a top surface 11 of the substrate 10 is flat. In this embodiment, the substrate 10 is a printed circuit board.

The LED chip 20 is mounted on the top surface 11 of the substrate 10. The LED chip 20 includes a pair of wires 21. The LED chip 20 electrically connects with circuit (not shown) of the substrate 10 via the wires 21. Alternatively, the LED chip 20 can be a chip assembly having a plurality of chips which can generate light beams with different wavelengths.

The blocking structure 30 is disposed on the substrate 10. In this embodiment, the blocking structure 30 is annular. The blocking structure 30 includes a resisting surface 31; that is, the resisting surface 31 is an outer surface of the blocking structure 30. The blocking structure 30 is made of ceramic materials such as aluminum oxides ($AL_2O_3$) or aluminum nitride (AlN). Alternatively, a metal layer can be formed on surfaces of the blocking structure, to function as a reflecting layer for strengthening the light outputting efficiency of the LED chip 20. In other embodiment, the blocking structure 30 is not limit to annular. The blocking structure 30 could include a plurality of blocks spaced from each other, and the blocks are arranged to be annular to thereby surround the LED chip 20. In such an embodiment, preferably at least three spaced and arced blocks are arranged together to form the blocking structure 30 to surround the LED chip 20. Alternatively, the blocking structure 30 can be made of metal or silicone.

The encapsulation body 40 is formed on the substrate 10. The encapsulation body 40 includes a mounting surface 41 and a light outputting surface 42. The LED chip 20 and the blocking structure 30 are received in the encapsulation body 40. When the LED package 100 works, light emitted from the LED chip 20 directly enters the encapsulation body 40 and radiates out of the encapsulation body 40 via the light outputting surface 42. The encapsulation body 40 is made of transparent materials such as silicone. Furthermore, the encapsulation body 40 can be mixed with fluorescent particles whereby light generated by the LED chip 20 can be mixed with light generated by the fluorescent particles to generate light having a desired color.

The encapsulation body 40 is formed by dispensing molding. The blocking structure 30 is covered by the encapsulation body 40. An outer (i.e., lateral) surface of the blocking structure 30 is continuously and smoothly connected with the light outputting surface 42. The light outputting surface 42 above the outer surface of the blocking structure 30 forms a hemispherical surface. A bottom end of the encapsulation body 40 is enclosed by the blocking structure 30. Specifically, a normal line A is defined which is extended from the resisting surface 31 and perpendicular to the substrate 10. A tangent line B is defined which is tangent to the light outputting surface 42 at a point thereof adjacent to the blocking structure 30. An angle θ is defined between the normal line A and the tangent line B.

When the encapsulation body 40 is manufactured, a periphery of the encapsulation body 40 directly connects with the resisting surface 31 of the blocking structure 30 in a vertical direction, instead of the conventional method that the periphery of the encapsulation body 40 directly connects with the top surface 11 of the substrate 10 in a horizontal direction. The blocking structure 30 holds the encapsulation body 40 therein and blocks the encapsulation body 40 from spreading on the substrate 10. Since the blocking structure 30 can help more material for forming the encapsulation body 40 to be accumulated in height direction of the LED package 100, the blocking structure 30 can help the encapsulation body 40 to be substantially hemisphere-shaped, and the angle θ between the normal line A and the tangent line B is smaller than 60 degrees. In this embodiment, the angle θ is smaller than 15 degrees.

A blocking structure 30 is disposed on the substrate 10, and the resisting surface of the blocking structure is continuously connected with the light outputting surface 42. The encapsulation body 40 is dispensed on the substrate 10 before the encapsulation body 40 is solidified, a bottom end of the periphery of the encapsulation body 40 is adjacent to the resisting surface 31. The blocking structure 30 holds the encapsulation body 40 therein and blocks the encapsulation body 40 from spreading on the substrate 10. Thus, the angle θ is smaller relative to the conventional LED package. The light outputting surface 42 is substantially hemisphere-shaped. An incident angle of the light generated by the LED chip 20 reaching the light outputting surface 42 of the encapsulation body 40 is more likely to be smaller than the critical angle of the encapsulation body 40, whereby probabilities of the lights being totally reflected are reduced, and the whole light output of the LED package 100 is increased. In addition, since the blocking structure 30 encloses the bottom end of the encapsulation body 40, there's no need to provide an extra structure to adjust a shape of the light outputting surface 42 of the encapsulation body 40.

Figure 2:
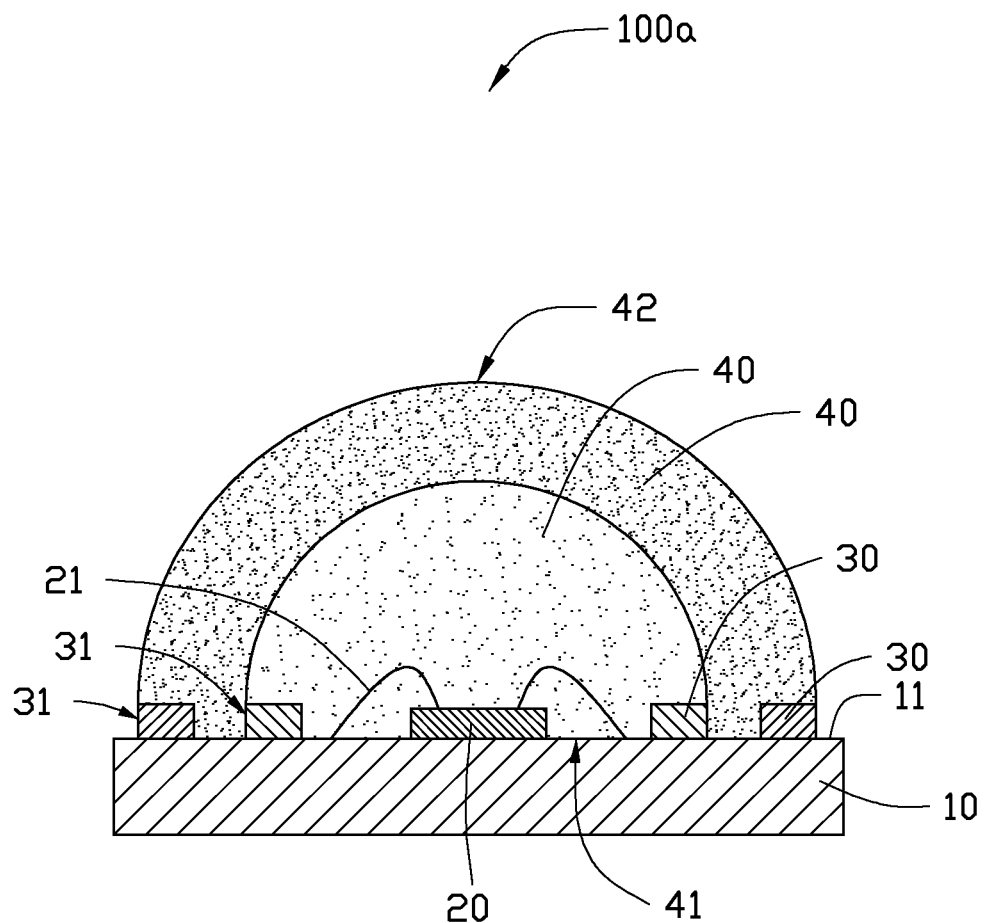
FIG. 2 is a cross-sectional view of an LED package with lens in accordance with another embodiment of the present disclosure.

Referring to FIG. 2, an LED package 100a in accordance with a second exemplary embodiment is shown. The LED package 100a is similar to the LED package 100 of the first embodiment. The difference between the LED package 100 and the LED package 100a is that the LED package 100a includes two groups of the blocking structure 30 and the encapsulation body 40. The encapsulation bodies 40 of the two groups are stacked together and are concentric with each other. In other words, the encapsulation body 40 of the outer group overlaps the encapsulation body 40 of the inner group. The blocking structure 30 of the outer group surrounds the blocking structure 30 of the inner group. When the LED package 100a is formed by dispensing molding, each blocking structure 30 supports a corresponding encapsulation body 40 and limits the angle θ to be arranged in a small degree. Alternatively, the encapsulation body 40 can be mixed with fluorescent particles whereby light generated by the LED chip 20 can be mixed with light generated from the fluorescent particles to obtain light with a desired color. The fluorescent particles in the inner encapsulation body 40 to be different from those in the outer encapsulation body 40, for example, that the fluorescent particles in the outer encapsulation body 40 can have a larger density.

Figure 3:
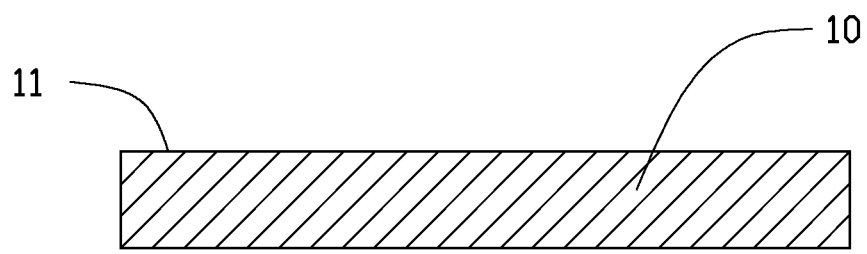
FIGS. 3 to 6 are the first step to the fourth step of the method for manufacturing the LED package with lens of FIG. 1.

The disclosure provides a manufacturing method for the LED package 100 which includes following steps:

Referring to FIG. 3, a substrate 10 is provided. The substrate 10 is rectangular. A top surface 11 of the substrate 10 is flat. In this embodiment, the substrate 10 is a printed circuit board.

Figure 4:
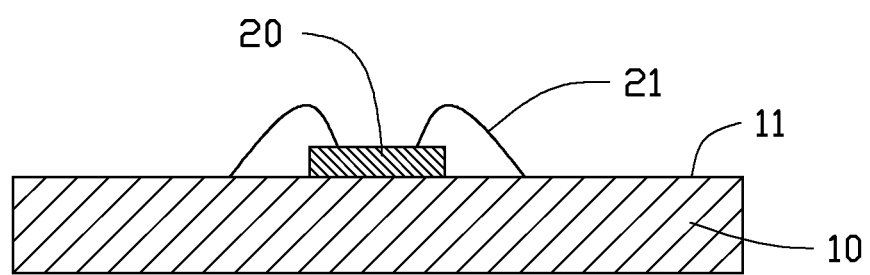

Referring to FIG. 4, an LED chip 20 is mounted on the top surface 11 of the substrate 10. The LED chip 20 includes a pair of wires 21; the LED chip 20 electrically connects with the substrate 10 via the two wires 21.

Figure 5:
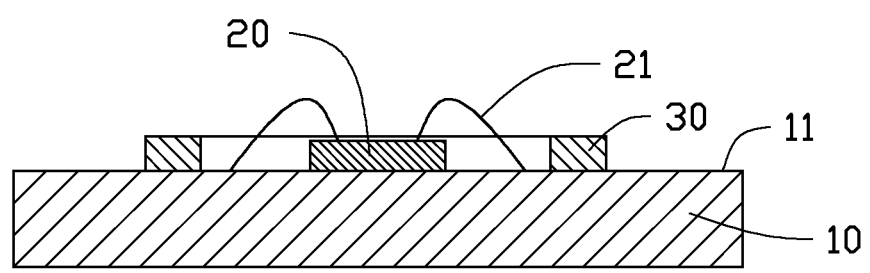

Referring to FIG. 5, a blocking structure 30 is provided and disposed on the substrate 10; the blocking structure 30 surrounds the LED chip 20. In this embodiment, the blocking structure 30 is annular. The blocking structure 30 includes a resisting surface 31; the resisting surface 31 is an outer lateral surface of the blocking structure 30. Alternatively, a metal layer is attached to surfaces of the blocking structure 30 to be a reflecting layer for increasing the light output of the LED package 100.

Figure 6:
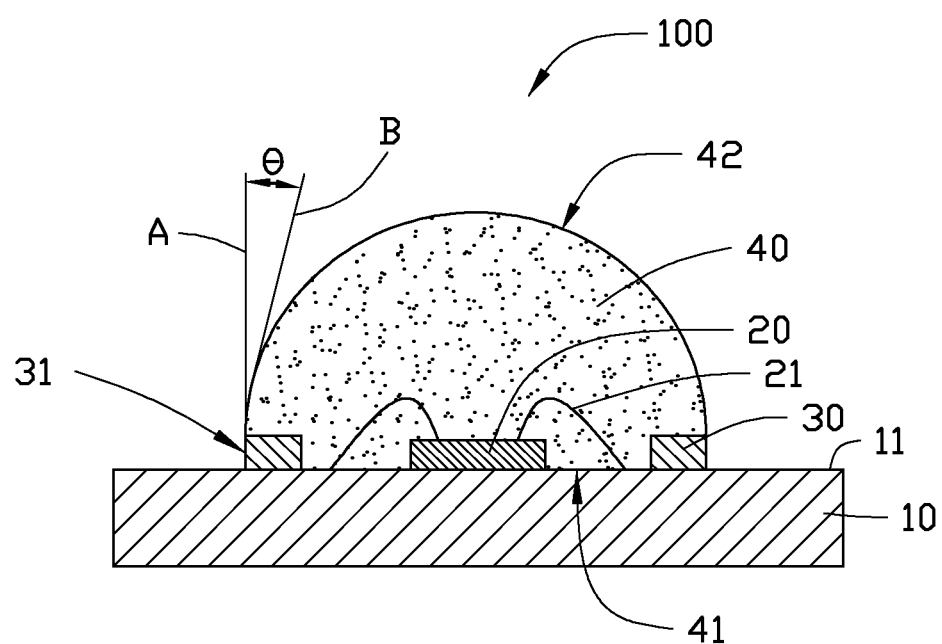

Referring to FIG. 6, gelatinous material for forming the encapsulation body 40 is dispensed into the space surrounded by the blocking structure 30 until the gelatinous material is positioned over the blocking structure 30 so that the whole blocking structure 30 and the LED chip 20 are covered by the gelatinous material. After the gelatinous material is cured to from the encapsulation body 40, the encapsulation body 40 directly and smoothly connects with the resisting surface 31 of the blocking structure 30 in a vertical direction. The blocking structure 30 holds the encapsulation body 40 therein and blocks the encapsulation body 40 from spreading on the substrate 10. The light outputting surface 42 of the encapsulation body 40 forms a hemispherical surface.

Alternatively, the blocking structure 30 and the encapsulation body 40 are not limited to be one group. Several groups of the blocking structure 30 and the encapsulation body 40 can be formed on the substrate 10 and stacked together, wherein the encapsulations 40 of the different groups are concentric, as shown in FIG. 2.

It is to be understood that the above-described embodiments are intended to illustrate rather than limit the disclosure. Variations may be made to the embodiments without departing from the spirit of the disclosure. The above-described embodiments illustrate the scope of the disclosure but do not restrict the scope of the disclosure.

What is claimed is:

1. A light emitting diode package, comprising:
    a substrate having a flat top surface;
    a light emitting diode chip mounted on the top surface of the substrate and electrically connecting with the substrate;
    a blocking structure formed on the substrate and surrounding the light emitting diode chip therein, a metal layer covering surfaces of the blocking structure to perform as a light reflecting layer; and
    an encapsulation body formed on the substrate to encapsulate the light emitting diode chip therein, a bottom of the encapsulation body being enclosed by the blocking structure, the encapsulation body having a light outputting surface, and an outer surface of the blocking structure being continuously connected with the light outputting surface, wherein the encapsulation body comprises a light outputting surface, the blocking structure comprising a resisting surface, the resisting surface being the outer surface of the blocking structure, a normal line being defined extending from the resisting surface and being perpendicular to the substrate, a tangent line being defined tangent to the light outputting surface at a point thereof adjacent to the resisting surface, and an angle between the normal line and the tangent line is being smaller than 60 degrees.

2. The light emitting diode package of claim 1, wherein the angle is smaller than 15 degrees.

3. The light emitting diode package of claim 1, wherein the blocking structure comprises a plurality of blocks spaced from each other, the blocks being arranged together to define an annular structure surrounding the light emitting diode chip.

4. The light emitting diode package of claim 1, wherein the blocking structure is made of ceramic material.

5. The light emitting diode package of claim 1, wherein the blocking structure is made of metal.

6. The light emitting diode package of claim 1, wherein the blocking structure is made of silicone.

7. The light emitting diode package of claim 1, further comprising another group of blocking structure and encapsulation body, wherein the blocking structure of the another group surrounds the blocking structure and the encapsulation body of the another group overlaps the encapsulation body and is concentric therewith.

8. A method for manufacturing a light emitting diode package comprising steps:
- providing a substrate, a top surface of the substrate being flat;
- mounting a light emitting diode chip on the top surface of the substrate and electrically connecting the light emitting diode chip with the substrate;
- forming a blocking structure on the substrate, wherein the blocking structure surrounds the light emitting diode chip, wherein a metal layer is attached to surfaces of the blocking structure to function as a light reflecting layer; and
- dispensing a gelatinous material for forming an encapsulation body on the substrate to encapsulate the light emitting diode chip therein, a bottom of the encapsulation body being enclosed by the blocking structure, the encapsulation body having a light outputting surface, and an outer surface of the blocking structure being continuously connected with the light outputting surface, wherein the blocking structure comprises a resisting surface, the resisting surface being the outer surface of the blocking structure, a normal line being defined extending from the resisting surface and being perpendicular to the substrate, a tangent line being defined tangent to the light outputting surface at a point thereof adjacent to the resisting surface, and an angle between the normal line and the tangent line being smaller than 60 degrees.

9. The method for manufacturing a light emitting diode package of claim 8, wherein the encapsulation body is formed on the substrate by dispensing molding.

10. The method for manufacturing a light emitting diode package of claim 8, wherein the angle is smaller than 15 degrees.

11. The method for manufacturing a light emitting diode package of claim 8, wherein the blocking structure comprises a plurality of blocks spaced from each other, the blocks being arranged together to define an annular structure surrounding the light emitting diode chip.

12. The method for manufacturing a light emitting diode package of claim 8, wherein the blocking structure is made of ceramic material.

13. The method for manufacturing a light emitting diode package of claim 8, wherein the blocking structure is made of metal.

14. The method for manufacturing a light emitting diode package of claim 8, wherein the blocking structure is made of silicone.

15. The method for manufacturing a light emitting diode package of claim 8, further comprising forming another group of blocking structure and encapsulation body on the blocking structure and the encapsulation body, wherein the blocking structure of the another group surrounds the blocking structure and the encapsulation body of the another group overlaps the encapsulation body and is concentric therewith.

* * * * *